United States Patent
Lopez et al.

(10) Patent No.: US 7,212,029 B2
(45) Date of Patent: May 1, 2007

(54) CIRCUIT ARRANGEMENT FOR THE OPERATION OF A SWITCHING TRANSISTOR

(75) Inventors: Daniel Lopez, Villingen-Schwenningen (DE); Jean-Paul Louvel, Brigachtal (DE); Harald Grellmann, Königsfeld im Schwarzwald (DE)

(73) Assignee: Thomson Licensing, Boulogne-Billancourt (FR)

( * ) Notice: Subject to any disclaimer, the term of this patent is extended or adjusted under 35 U.S.C. 154(b) by 207 days.

(21) Appl. No.: 11/092,325

(22) Filed: Mar. 29, 2005

(65) Prior Publication Data

US 2005/0225356 A1    Oct. 13, 2005

(30) Foreign Application Priority Data

Mar. 31, 2004   (EP)   ................... 04007795

(51) Int. Cl.
  *H03K 19/003*   (2006.01)
  *H03K 19/0175*  (2006.01)
(52) U.S. Cl. ......................................... 326/33; 326/83
(58) Field of Classification Search .................. 326/83, 326/31, 33, 82, 84
  See application file for complete search history.

(56) References Cited

U.S. PATENT DOCUMENTS 4,947,063 A    8/1990   Shaughnessy et al.
5,041,741 A *  8/1991   Steele .......................... 326/33
5,663,659 A *  9/1997   Kaminaga et al. ............ 326/17
6,219,262 B1   4/2001   Burgyan

FOREIGN PATENT DOCUMENTS

DE   4223274    7/1991
EP   0359851    3/1990
EP   1143618    10/2001

OTHER PUBLICATIONS

EPO Search Report, Aug. 30, 2004.
Patent Abstracts of Japan vol. 018, No. 280 (E-1555) May 27, 1994 & JP 06 053795 Fuji Electric Co. Ltd. Feb. 25, 1994.
U. Tietze, Ch. Schenk: "Hal;bleiterscahltungstechnik 10. Auflage" 1993, Springer Verlag, Berlin, no month.

* cited by examiner

*Primary Examiner*—James H. Cho
(74) *Attorney, Agent, or Firm*—Joseph J. Laks; Harvey D. Fried

(57) ABSTRACT

The circuit arrangement comprises a driver stage and a control circuit coupled to the control input of a switching transistor. The driver stage provides a switching voltage for the operation of the switching transistor, and the control circuit provides a shaping of the switching voltage in the sense of delaying the switching through of the switching transistor. The control circuit comprises in particular a control transistor, which is coupled a control input via a high pass filter to the output of the driver stage and with an current input to the control input of the switching transistor. The switching transistor is for example a MOSFET being used for switching on and off a capacitive load.

8 Claims, 2 Drawing Sheets

CIRCUIT ARRANGEMENT FOR THE OPERATION OF A SWITCHING TRANSISTOR

This application claims the benefit, under 35 U.S.C. § 119 of EPO Patent Application 04007795, filed Mar. 31, 2004.

FIELD OF THE INVENTION

The present invention relates to a circuit arrangement comprising a driver stage for the operation of a switching transistor. The switching transistor is used in particular for switching on and off a supply voltage for a capacitive load.

BACKGROUND

For switching off a load completely, the best solution is, to disconnect the input voltage. Then the load is in a safe mode and does not have any power consumption. For disconnecting an input supply voltage to a load, for example a relay can be used as a switch. But most of the relays are not designed for the operation of a high DC voltage, for example 400 Volts, and for high power loads above 200 Watts. Therefore, a standard relay cannot be used, which makes this solution rather expensive.

For switching a DC supply voltage to a load, also a switching transistor can be used, for example a MOSFET. The switching transistor can be coupled for example on the high side between the DC supply voltage and a first input terminal of the load, and the second input terminal of the load being coupled to ground. Or in a second embodiment, the switching transistor is coupled between the load and ground, and an input terminal of the load is coupled directly to the DC supply voltage. In case a high power capacitive load is used, the switching transistor has to handle rather high switching losses, when the load is switched on.

SUMMARY OF THE INVENTION

The circuit arrangement according to the invention comprises a driver stage coupled to a control input of a switching transistor, for providing a switching voltage for the operation of the switching transistor. The circuit arrangement comprises further a control circuit coupled to the control input for shaping the switching voltage in the sense of delaying the switching through of the switching transistor.

The inventors have recognized, that the power dissipation stress for the switching transistor is reduced, when the switching voltage, which is applied to the control input of the switching transistor for switching through, is shaped in the sense of delaying the switching through of the switching transistor. With the delayed switching through, the power dissipation is distributed over a larger time interval. This provides a lower power dissipation per time unit. Therefore, when shaping a rectangular switching voltage in this manner, a smaller switching transistor can be used, in particular a switching transistor with a smaller chip area can be used. An additional heat sink is not required.

In a first embodiment, the control circuit comprises a current sense impedance coupled in series with the switching transistor, and a control transistor, which is coupled with a control input to the current sense impedance and with a current input to the control input of the switching transistor. The circuit arrangement provides therefore a negative feedback between the current passing through the switching transistor and the input of the switching transistor in the sense, that the control voltage for switching through the switching transistor is reduced, when the switching transistor opens and a respective current flows through the switching transistor.

In a second embodiment, the control input of the control transistor is coupled further with the output of the driver stage, in particular via a low pass filter. The control transistor is embedded in a voltage divider chain, which is coupled between the output of the driver stage and ground. The switching transistor is therefore switched through in a delayed manner, which extends the heat dissipation of the switching transistor over a longer time interval.

BRIEF DESCRIPTION OF THE DRAWINGS

Preferred embodiments of the invention are explained in more detail with regard to schematic drawings, which show.

DESCRIPTION OF PREFERRED EMBODIMENTS

Figure 1:
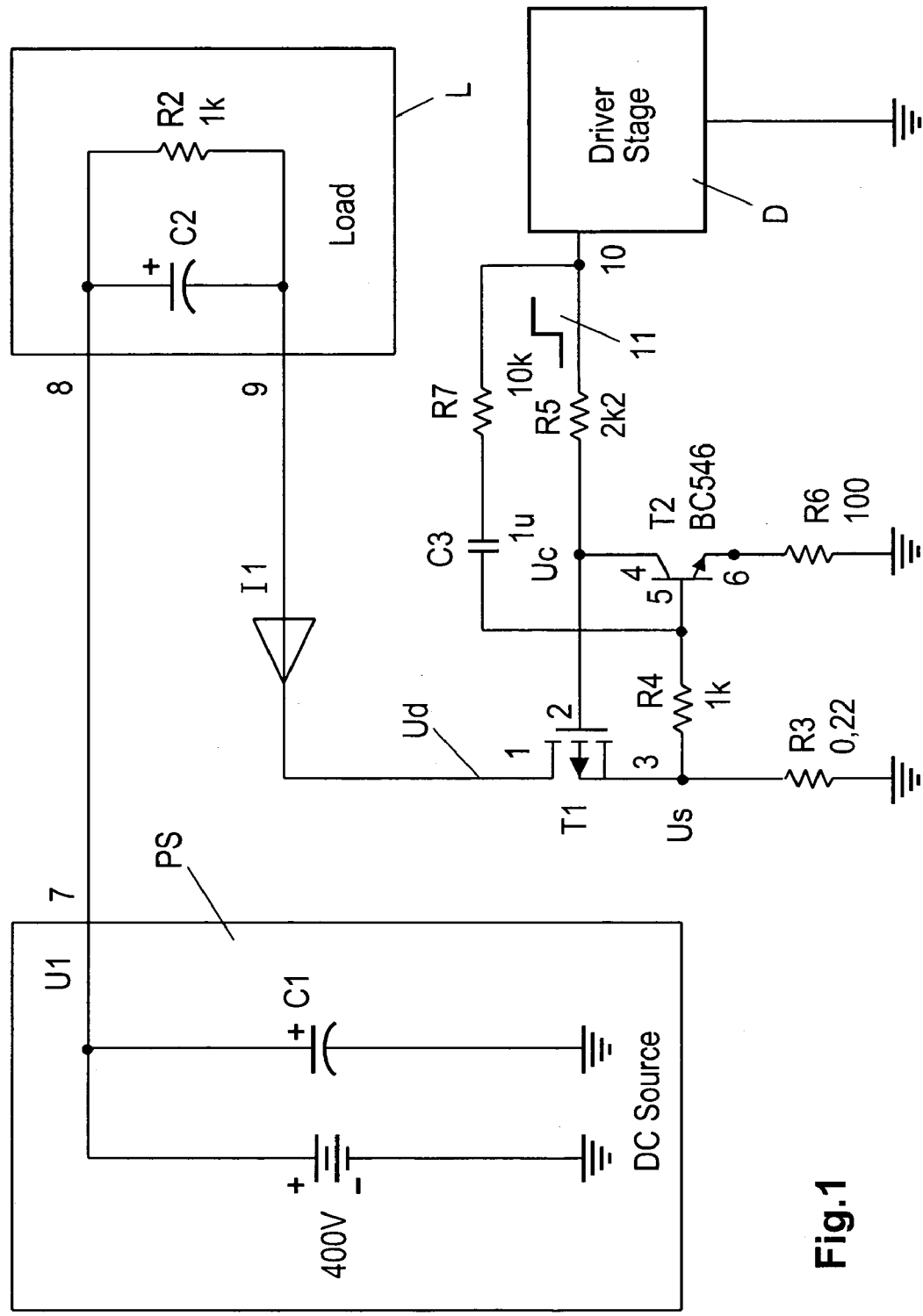
FIG. 1 a circuit arrangement comprising a driver stage for the operation of a switching transistor, and FIG. 2 diagrams showing control voltages and currents of the circuit arrangement according to FIG. 1.

In FIG. 1 a circuit arrangement is shown for the operation of a switching transistor T1. The switching transistor T1 is coupled with a current input to a first supply voltage terminal 9 of a load L and with a current output 3 to a reference potential, in this embodiment to ground. A second supply voltage terminal 8 of the load L is coupled to an output terminal 7 of a DC source PS providing a positive DC supply voltage U1. As the switching transistor T1 in particular a MOSFET is used.

The load L is in particular a high power capacitive load. In a preferred application, the load is a digital light processing (DLP) unit, being used within a television set for displaying a television program. A DLP unit of this kind requires a supply voltage U1 of about 400 Volts with a maximum power of 220 Watts. The capacitor C2 included in the DLP unit may have for example a value of 47 µF.

The circuit arrangement for operating the switching transistor T1 comprises a driver stage D, which provides at an output 10 a rectangular control voltage 11 for the operation of the switching transistor T1. The control voltage 11 is applied to a control input 2 of the switching transistor T1 for switching the load L on and off. The switching voltage 11 is shaped by an additional control circuit coupled to the control input 2 for delaying the switching through of the switching transistor T1.

In a first embodiment, the control circuit comprises a current sense impedance R3, in this embodiment a resistor, which is coupled in series to the load L and the switching transistor T1. The impedance R3 is in this embodiment a resistor, which is coupled between a current output 3 of the switching transistor T1 and ground. The resistor R3 provides a sense voltage Us, which is coupled via a resistor R4 to a control input 5 of a control transistor T2. The control transistor T2 is coupled with a current input 4 to the control input 2 of the switching transistor T1, for shaping the switching voltage 11.

The transistor T2 is arranged within a voltage divider chain with a resistor 5 coupled to the output 10 of the driver stage D and a resistor R6 coupled to ground. The resistance value of the resistor R5 is high in comparison with the value of resistor R6. Therefore, when a switching voltage 11 is applied via resistor R5 to the control input 2 of the switching transistor T1, a negative feedback is provided via the transistor T2 between the current output 3 to the control input 2, which smoothes the steep rise of the rectangular voltage 11.

The operation of this embodiment is as follows: When the driver stage D switches on the load L by means of the switching voltage 11, a voltage Us is generated across sensing resistor R3, which opens the control transistor T2 at least partly. Then the voltage applied to the control input 2 is reduced, reducing therefore also the current I1 for the capacitor C2. After some time, when the capacitor C2 is charged up, the current I1 is reduced to a value as necessary for the operation of the DLP unit. Then the sensing voltage Us is also reduced to a value, which is not sufficient for opening the control transistor T2. Hence, the full amplitude of the switching voltage 11 is present at the control input 2, and the switching transistor T1 is switched through therefore completely in normal operation.

In a second embodiment, the circuit arrangement comprises further a high-pass circuit, which is coupled between the output 10 of the driver stage D and the control input 5 of the control transistor T2. The high-pass circuit comprises in this embodiment a capacitor C3 and a resistor R7. Because of the high-pass characteristics, this circuit is only effective at the beginning of the switching voltage 11, until capacitor C3 is charged, when the rectangular voltage 11 switches from low to high. During the charging up of capacitor C3, transistor T2 is conducting, hence reducing the voltage Uc applied to the control input 2 of the switching transistor T1.

Figure 2:
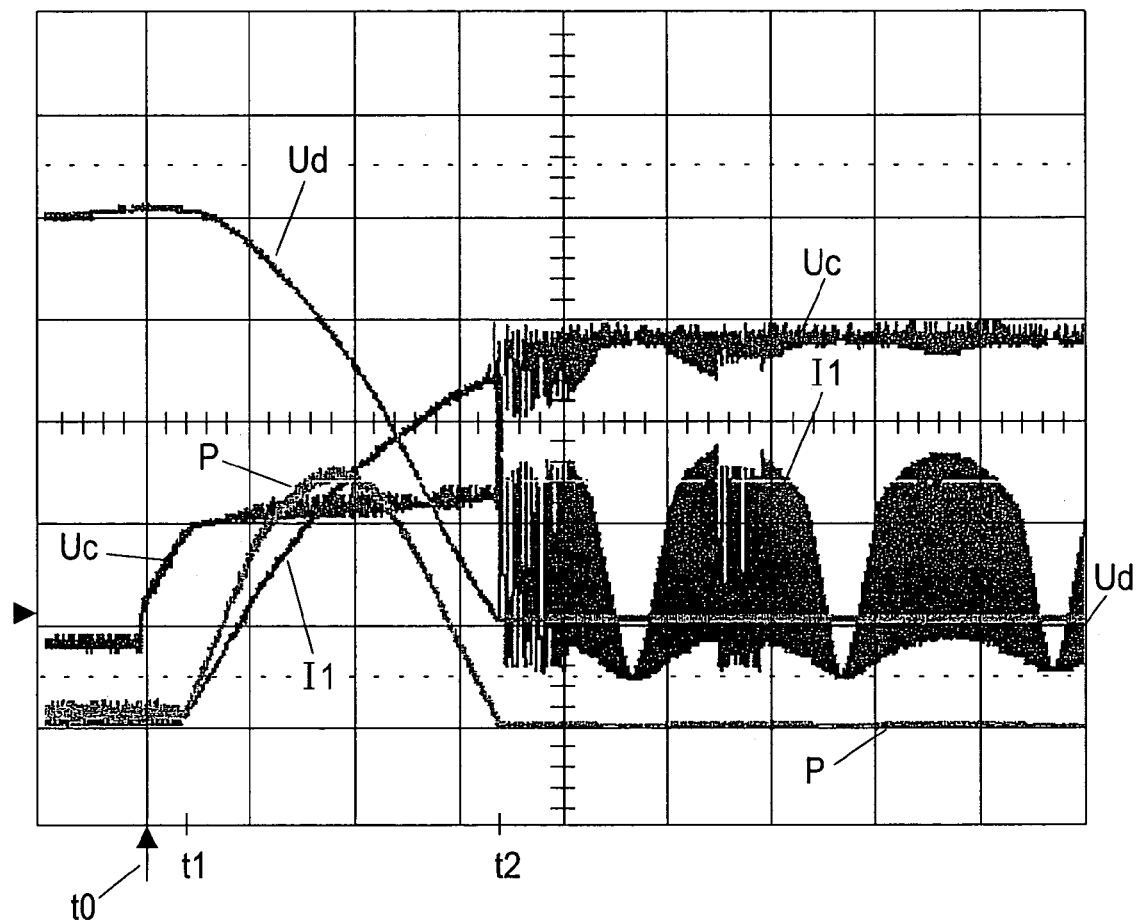

The operation of this embodiment is now explained with regard to FIG. 2: At time t0, the driver stage D provides a rectangular switching-on voltage 11 at output 10. Because of the high-pass circuit C3, R7, the control transistor is immediately switched through, which reduces the voltage Uc applied to the control input 2 of the switching transistor T1. Then, according to the charge up of capacitor C3, the current through transistor T2 is reduced. The voltage Uc is therefore rising with a delay, when compared with the steep slope of the rectangular switching voltage 11.

At time t1, the voltage Uc is sufficient for switching through the switching transistor T1. The voltage Ud present a current input 1 of the switching transistor T1 is then decreasing continuously after time t1, until reaching zero at time t2. At the same time, the current I1 through the switching transistor T1 is rising. Because the current I1 generates the sense voltage Us, the voltage Uc applied to the control input 2 of switching transistor T1 is smoothed with regard to the rectangular slope of the switching voltage 11 and after time t1, the voltage Uc is rising only slowly.

At the time t2, the control transistor T2 switches off completely, which effects a further rising of the voltage Uc to a level, corresponding to the amplitude of the switching voltage 11. The current I1 through switching transistor T1 rises therefore continuously from time t1 to t2, at which the switching transistor T1 is switched through completely. After the time t2, the current I1 is modulated by the operation of the DLP unit and by residual switching noise superimposed on the DC voltage U1.

The resulting power consumption P of the switching transistor T1 has a sinusoidal shape therefore, which is zero from time t0 to t1 and reaches again zero at time t2. Hence, the power consumption of the switching transistor T1 is distributed over a comparatively large time interval t1–t2, which is about 15 milliseconds. The peak power in the switching transistor 1 is therefore reduced by factor of 3 to 4 in comparison with a circuit, which applies a rectangular switching voltage to the control input 2 of the switching transistor T1. Accordingly, the dissipated head stress of the switching transistor 1 is reduced, when shaping the switching voltage 11 by a control circuit, as described before. A smaller and cheaper switching transistor 1 can be used therefore.

The present invention is not limited to the embodiments as described before with regard to the figures, and various available modifications come possible for those skilled in the art without departing from the scope of the invention. For example, the circuit arrangement with the driver stage may be integrated within an integrated circuit, or is implemented with discrete circuit elements. The circuit arrangement is in particular advantageous for switching on a capacitive load, but other applications are also possible.

The invention claimed is:

1. Circuit arrangement comprising
   a driver stage coupled to a control input of a switching transistor for providing a switching voltage for the operation of the switching transistor, and
   a control circuit coupled via an output to said control input for shaping said switching voltage in the sense of delaying the switching through of said switching transistor,
   said control circuit comprising a control transistor being coupled with a control input to the output of the driver stage via a high pass filter and with a current input to said control input of said switching transistor for providing a negative feedback.

2. Circuit arrangement according to claim 1, wherein a current sense impedance is coupled in series with the switching transistor, and the control transistor is coupled with the control input to the current sense impedance and with the current input to the control input of the switching transistor for providing the negative feedback.

3. Circuit arrangement according to claim 2, wherein the control transistor is coupled in series with a voltage divider chain, which is coupled between an output of the driver stage and a reference potential.

4. Circuit arrangement according to claim 2, wherein a resistor is arranged between the output of the driver stage and the control input of the switching transistor, and that the current input of the control transistor is connected to the control input of the switching transistor.

5. Circuit arrangement according to claim 1, wherein said high pass filter comprises a capacitor and a resistor in series.

6. Circuit arrangement according to claim 2, wherein said current sense impedance is a resistor, which is coupled between said switching transistor and a reference potential, that a current output of said control transistor is coupled to said reference potential, and that said control input of said control transistor is coupled via a resistor to said current sense impedance.

7. Circuit arrangement according to claim 1, wherein said switching transistor is a MOSFET coupled in series with a load, in particular with a capacitive load.

8. Circuit arrangement according to claim 7, wherein said switching transistor is arranged between said load and a reference potential.

* * * * *